(12) United States Patent
Chen

(10) Patent No.: US 8,185,329 B2
(45) Date of Patent: May 22, 2012

(54) SYSTEM FOR TESTING MATRIX TYPE CONNECTOR

(75) Inventor: Yang-Xin Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 312 days.

(21) Appl. No.: 12/562,684

(22) Filed: Sep. 18, 2009

(65) Prior Publication Data

US 2010/0332162 A1  Dec. 30, 2010

(30) Foreign Application Priority Data

Jun. 30, 2009 (CN) .......................... 2009 1 0303860

(51) Int. Cl.
*G01R 31/00* (2006.01)
*G01R 31/04* (2006.01)

(52) U.S. Cl. .......................................... 702/58; 324/538

(58) Field of Classification Search .................. 702/58; 324/538

See application file for complete search history.

(56) References Cited

U.S. PATENT DOCUMENTS

| 5,388,032 | A * | 2/1995 | Gill et al. ..................... 700/17 |
| 5,559,993 | A * | 9/1996 | Elliott et al. .................. 711/163 |
| 5,943,468 | A * | 8/1999 | Takayama ..................... 386/264 |
| 5,996,402 | A * | 12/1999 | Harris ............................ 73/49.7 |
| 6,441,627 | B1 * | 8/2002 | Larson ........................... 324/538 |
| 7,478,299 | B2 * | 1/2009 | Brandyberry et al. ........ 714/727 |
| 7,586,475 | B2 * | 9/2009 | Lee et al. ........................ 345/98 |
| 2004/0216011 | A1* | 10/2004 | Co et al. .......................... 714/42 |
| 2006/0119385 | A1* | 6/2006 | Balasubramanian et al. .. 326/38 |
| 2009/0251837 | A1* | 10/2009 | Fiebrich et al. .............. 361/93.9 |

* cited by examiner

*Primary Examiner* — Janet Suglo
(74) *Attorney, Agent, or Firm* — Altis Law Group, Inc.

(57) ABSTRACT

A system for testing a matrix type connector includes a data collecting circuit, a control circuit, a storage unit, and a display unit. The data collecting circuit collects the connector pins' information, and transmits the collected pins' information to the control circuit. The storage unit is electrically coupled to the control circuit and stores a plurality of normal pins' information. The control circuit compares the collected pins' information with the plurality of stored normal pins' information, and outputs the comparison result to the display unit. The display unit receives the comparison result to indicate whether pins of the matrix type connector are normal.

15 Claims, 3 Drawing Sheets

SYSTEM FOR TESTING MATRIX TYPE CONNECTOR

BACKGROUND

1. Technical Field

The present disclosure relates to testing systems, and particularly to a system for testing a matrix type connector.

2. Description of Related Art

Matrix type connectors are commonly used in blade type servers to establish connection between surface mount devices. A matrix type connector comprises a plurality of pins which are integrally formed with the connector. For improving the reliability of the matrix type connector, open circuit testing and short circuit testing are important tests for the reliability of matrix type connector. A typical method for testing open circuit and short circuit is by an in current test (ICT) using a plurality of probes. However, ICT with probes may easily damage pins of the connector.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
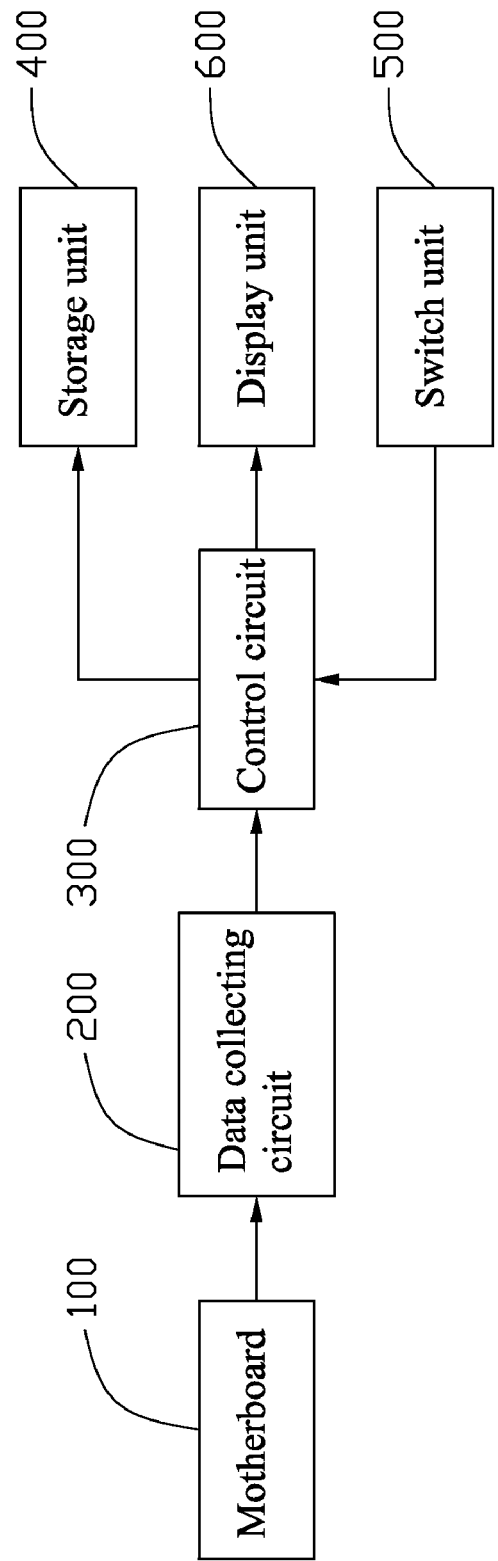
FIG. 1 is a block diagram of a system for testing matrix type connector, in accordance with an embodiment.

Referring to FIG. 1, a system for testing a matrix type connector (not shown) includes a motherboard 100, a data collecting circuit 200, a control circuit 300, a storage unit 400, a switch unit 500, and a display unit 600. The data collecting circuit 200 collects the connector pins' information on the motherboard 100, and transmits the collected pins' information to the control circuit 300. The storage unit 400 is electrically coupled to the control circuit 300 and stores a plurality of normal pins' information. The control circuit 300 compares the collected pins' information with the plurality of stored normal pins' information, and outputs the comparison result to the display unit 600. The display unit 600 receives the comparison result to indicate whether pins of matrix type connector on the motherboard 100 are normal (e.g. in good condition). The switch unit 500 is electrically coupled to the control circuit 300 and is capable of inputting password in the control circuit 300 to store the plurality of normal pins' information in the storage unit 400.

Figure 2:
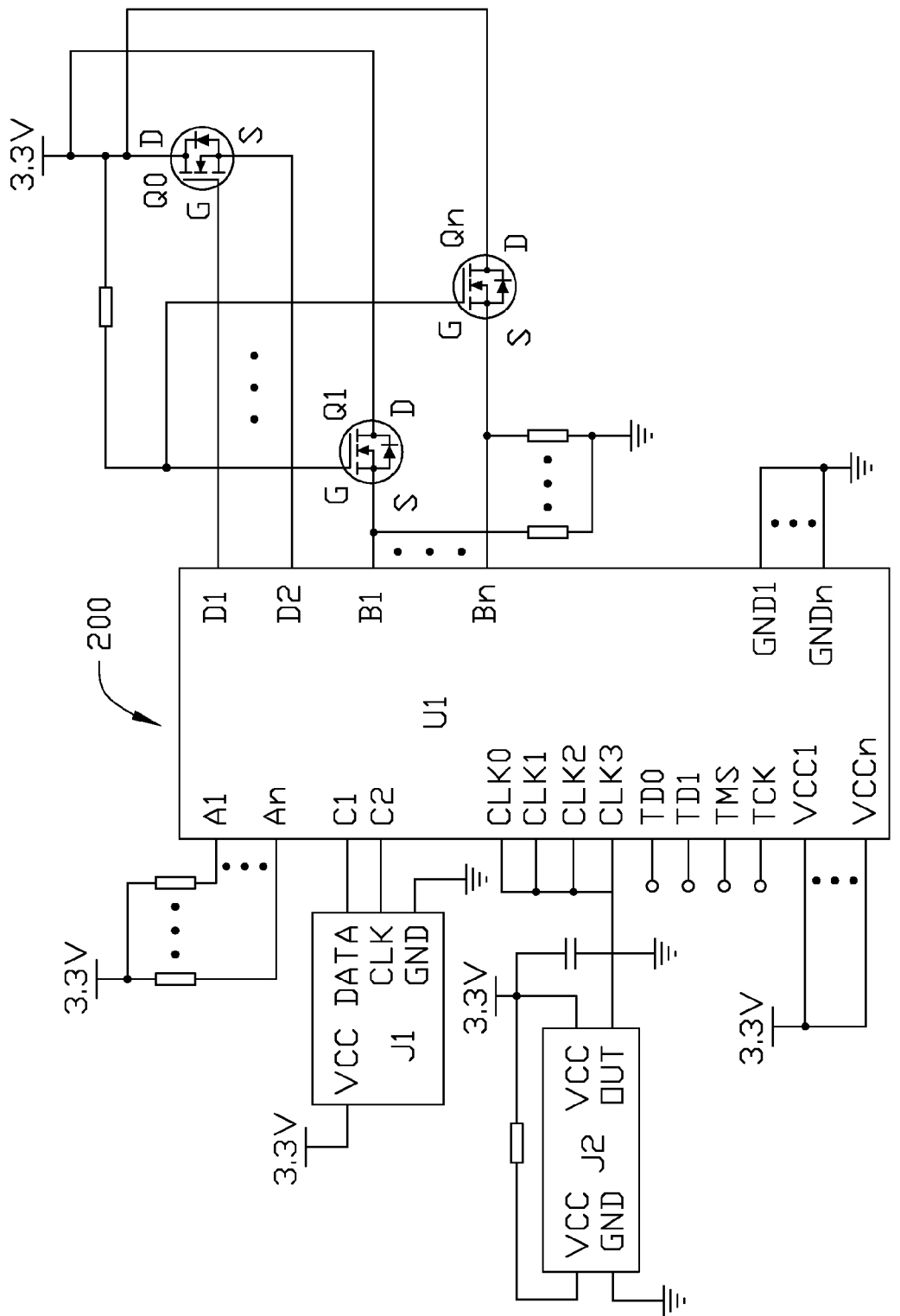
FIG. 2 is a circuit diagram of a data collecting circuit of FIG. 1.

Referring to FIG. 2, the data collecting circuit 200 includes a complex programmable logic device (CPLD) unit U1, a data transmitting connector J1, a crystal oscillator J2, a plurality of MOSFETs Q0, Q1~Qn, and a plurality of resistors (not labeled). The CPLD unit U1 includes a plurality of data collecting pins A1~An, B1~Bn, a data transmitting pin C1, clock pins C2, CLK0~CLK3, program burning pins TD0, TD1, TMS, TCK, control pins D1, D2, a plurality of power pins VCC1~VCCn, and a plurality of ground pins GND1~GNDn. The plurality of data collecting pins A1~An are electrically coupled to a 3.3V DC voltage via the plurality of resistors. The plurality of data collecting pins B1~Bn are grounded via the plurality of resistors. The data transmitting connector J1 has a data terminal DATA and a clock terminal CLK, the data transmitting pin C1 and clock pin C2 are electrically coupled to the data terminal DATA and the clock terminal CLK respectively. The plurality of data collecting pins A1~An, B1~Bn are capable of electrically connecting with pins of matrix type connector on the motherboard 100 to collect the pins' information. The CPLD unit U1 processes the collected pins' information which is then outputted at the data transmitting pin C1. The crystal oscillator J2 has an oscillating output terminal OUT, the clock pins CLK0~CLK3 are electrically coupled to the oscillating output terminal OUT. The control pins D1, D2 are electrically coupled to the MOSFET Q0 gate and source respectively. The MOSFET Q0 drain is electrically coupled to the 3.3V DC voltage. The plurality of data collecting pins B1~Bn are electrically coupled to the corresponding MOSFETs Q1~Qn sources respectively. The MOSFETs Q1~Qn gates and drains are electrically coupled to the 3.3V DC voltage.

The CPLD unit U1 is capable of charging or discharging electronic devices (not shown) electrically coupled to the pins of matrix type connector by turning on or off the plurality of MOSFETs Q0, Q1~Qn to obtain pins' information. The plurality of power pins VCC1~VCCn are electrically coupled to the 3.3V DC voltage. The plurality of ground pins GND1~GNDn are grounded. The plurality of MOSFETs Q0, Q1~Qn are N-channel MOSFET. An oscillating frequency of the crystal oscillator J2 is 25 MHZ.

Figure 3:
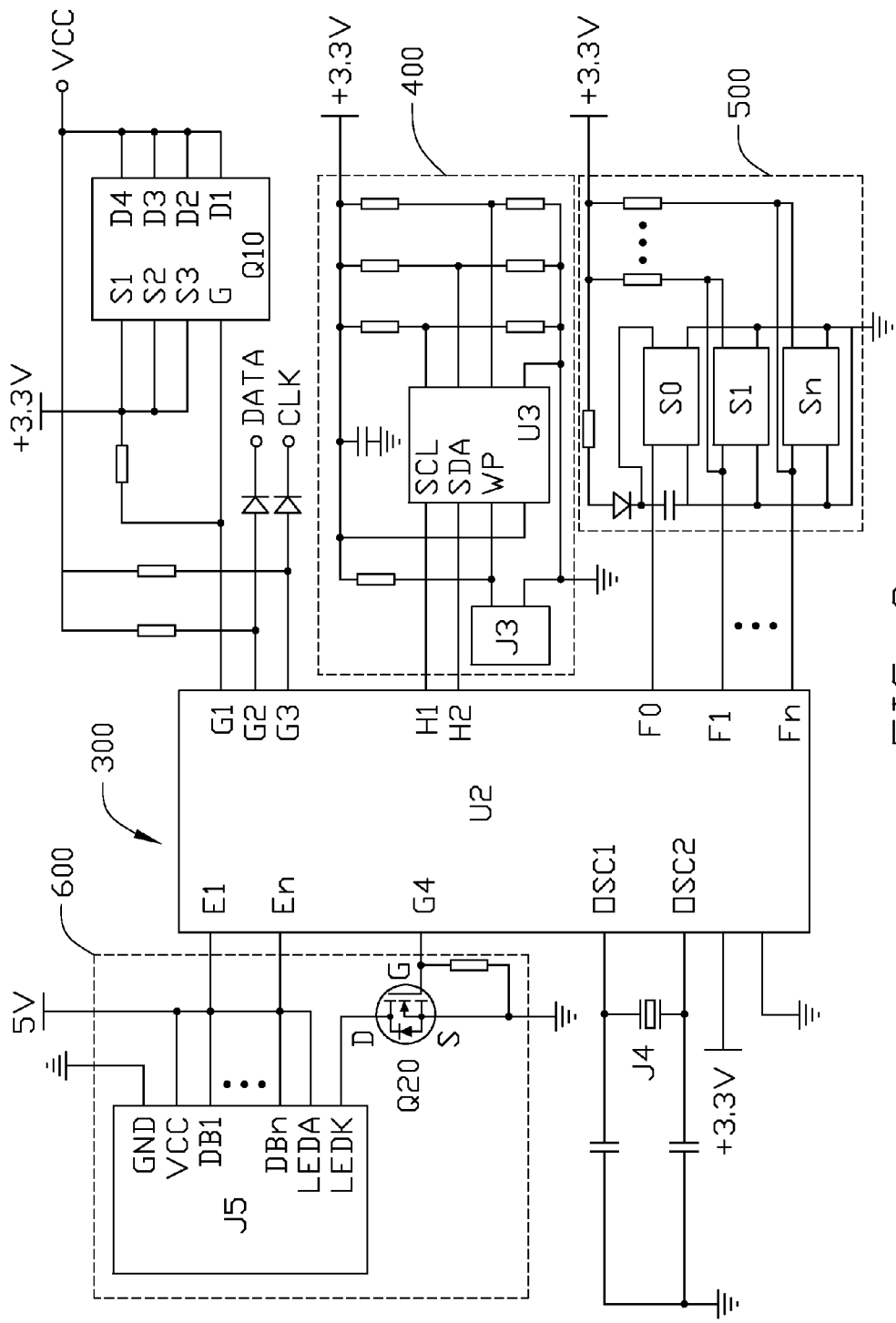
FIG. 3 is a circuit diagram of a control circuit of FIG. 1 connecting with a storage unit, a switch unit, and a display unit.

Referring to FIG. 3, the control circuit 300 includes a microcontroller U2, and a MOSFET Q10. The microcontroller U2 includes a plurality of data input pins H1, H2, F0~Fn, control pins G1, G4, a data receiving pin G2, a clock pin G3, an oscillating input pin OSC1, an oscillating output pin OSC2, and a plurality of data output pins E1~En. The MOSFET Q10 has a gate G, sources S1~S3, and drains D1~D4. The control pin G1 is electrically coupled to the gate G and sources S1~S3. The data receiving pin G2 and clock pin G3 are electrically coupled to the drains D1~D4. The microcontroller U2 is capable of charging or discharging the CPLD unit U1 by turning on or off the MOSFET Q10 to avoid damage of the CPLD unit U1 during hot plugging the CPLD unit U1 on the motherboard 100. The oscillating input pin OSC1 and oscillating output pin OSC2 are grounded via a crystal oscillator J4. The data receiving pin G2 and clock pin G3 are electrically coupled to the data transmitting connector J1 data terminal DATA and clock terminal CLK respectively. The MOSFET Q10 is a power type MOSFET. An oscillating frequency of the crystal oscillator J4 is 12 MHZ.

The storage unit 400 includes an electrically erasable programmable read-only memory (EEPROM) U3, and a jumper device J3. The EEPROM U3 has a serial clock terminal SCL, a serial data terminal SDA, and a write-protect terminal WP. The microcontroller U2 data input pins H1, H2 are electrically coupled to the serial clock terminal SCL and serial data terminal SDA respectively. The write-protect terminal WP is grounded via the jumper device J3. The EEPROM U3 stores the plurality of normal pins' information which is erasable by shorting the jumper device J3. The EEPROM U3 is capable of writing the plurality of normal pins' information by opening the jumper device J3.

The switch unit 500 includes a plurality of switches S0~Sn. The microcontroller U2 data input pins F0~Fn are electrically coupled to the plurality of switches S0~Sn respectively. The switch S0 is a resetting key for resetting password of the control circuit 300.

The display unit 600 includes a liquid crystal display (LCD) panel J5, and a MOSFET Q20. The LCD panel J5 has a plurality of data bus terminals DB1~DBn, and a backlight control terminal LEDK. The microcontroller U2 data output pins E1~En are electrically coupled to the plurality of data bus terminals DB1~DBn respectively. The microcontroller U2 control pin G4 is electrically coupled to the backlight control terminal LEDK via the MOSFET Q20. The microcontroller U2 controls the LCD panel J5 back lighting by turning on or off the MOSFET Q20.

During a test, the motherboard 100 is electrically coupled to the test system as shown in FIGS. 1~3. The CPLD unit U1 data collecting pins A1~An, B1~Bn collect the individual pin's information on the motherboard 100. The CPLD unit U1 processes the collected pins' information, and transmits the processed pins' information to the microcontroller U2 via the data transmitting pin C1. The microcontroller U2 compares the connector pins' information with the plurality of normal pins' information stored in the storage unit 400, and outputs the comparison result to the display unit 600. The display unit 600 indicates whether pins of matrix type connector on the motherboard 100 are normal according to the comparison result.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A system for testing matrix type connector, comprising:
a data collecting circuit capable of collecting pin' information from a matrix type connector;
a storage unit that stores a plurality of normal pins' information; wherein the storage unit comprises an electrically erasable programmable read-only memory (EEPROM), the EEPROM has a serial clock terminal, a serial data terminal, and a write-protect terminal; the write-protect terminal is grounded via a jumper device;
a control circuit capable of receiving the collected pins' information, comparing the collected pins' information with the stored normal pins' information, and outputting a comparison result; wherein the control circuit comprises a microcontroller having a first data input pin and a second data input pin which are electrically coupled to the serial clock terminal and serial data terminal respectively;
a switch unit electrically coupled to the control circuit capable of inputting a password into the control circuit to store the plurality of normal pins' information in the storage unit; and
a display unit capable of receiving the comparison result and indicating whether pins of the matrix type connector are normal.

2. The system of claim 1, wherein the data collecting circuit comprises a complex programmable logic device (CPLD) unit; the CPLD unit has a plurality of data collecting pins, a data transmitting pin, and at least one clock pin; the plurality of data collecting pins are capable of electrically connecting with the matrix type connector pins to obtain the collected pins' information; the CPLD unit is capable of processing the collected pins' information and outputting the processed information at the data transmitting pin.

3. The system of claim 2, wherein the microcontroller further comprises a data receiving pin and a clock port which are electrically coupled to the CPLD unit data transmitting pin and at least one clock pin respectively.

4. The system of claim 3, wherein the control circuit further comprises a power type MOSFET; the microcontroller is capable of charging or discharging the CPLD unit by turning on or off the power type MOSFET.

5. The system of claim 4, wherein the microcontroller further comprises a second control pin which is electrically coupled to the power type MOSFET gate and source; the microcontroller data receiving pin and clock pin are electrically coupled to the power type MOSFET drain.

6. The system of claim 1, wherein the display unit includes a LCD panel; the LCD panel has a plurality of data bus terminals and a backlight control terminal; the microcontroller further comprises a plurality of data output pins and a first control pin; the plurality of data output pins are respectively electrically coupled to the plurality of data bus terminals; the first control pin is electrically coupled to the backlight control terminal via a MOSFET.

7. The system of claim 1, wherein the switch unit comprises a plurality of switches; the microcontroller further comprises a plurality of third data input pins which are electrically coupled to the plurality of switches respectively.

8. A system for testing matrix type connector, comprising:
a data collecting circuit capable of collecting pins' information from a matrix type connector;
a storage unit that stores a plurality of normal pins' information;
a control circuit capable of receiving the pins' information of the data collecting circuit, comparing the collected pins' information with the plurality of normal pins' information of the storage unit, and outputting a comparison result;
a switch unit electrically coupled to the control circuit capable of inputting a password into the control circuit to store the plurality of normal pins' information in the storage unit; and
a display unit capable of receiving the comparison result and indicating whether pins of the matrix type connector are normal.

9. The system of claim 8, wherein the data collecting circuit comprises a complex programmable logic device (CPLD) unit; the CPLD unit has a plurality of data collecting pins, a data transmitting pin, and at least one clock pin; the plurality of data collecting pins are capable of electrically connecting with the matrix type connector pins to obtain the pins' information; the CPLD unit is capable of processing the pins' information of the data collecting circuit and outputting processed information at the data transmitting pin.

10. The system of claim 9, wherein the control circuit comprises a microcontroller, the microcontroller has a data receiving pin electrically coupled to the data transmitting pin of the CPLD unit, and a clock port electrically coupled to the at least one clock pin of the CPLD unit.

11. The system of claim 10, wherein the storage unit comprises an electrically erasable programmable read-only memory (EEPROM), the EEPROM has a serial clock terminal, a serial data terminal, and a write-protect terminal; the microcontroller further comprises a first data input pin electrically coupled to the serial clock terminal, and a second data input pin electrically coupled to the serial data terminal; the write-protect terminal is grounded via a jumper device.

12. The system of claim 10, wherein the display unit comprises a LCD panel; the LCD panel comprises a plurality of data bus terminals and a backlight control terminal; the microcontroller further comprises a plurality of data output pins, and a first control pin; each of the plurality of data output pins is electrically coupled to each of the plurality of data bus terminals; the first control pin is electrically coupled to the backlight control terminal via a MOSFET.

13. The system of claim 10, wherein the switch unit comprises a plurality of switches;

the microcontroller further comprises a plurality of third data input pins, each of the plurality of third data input pins is electrically coupled to each of the plurality of switches.

14. The system of claim 10, wherein the control circuit further comprises a power type MOSFET; the microcontroller is capable of charging or discharging the CPLD unit by turning on or off the power type MOSFET.

15. The system of claim 14, wherein the microcontroller further comprises a second control pin which is electrically coupled to gate electrode and source electrode of the power type MOSFET; the data receiving pin and the at least one clock pin of the CPLD unit are electrically coupled to drain electrode of the power type MOSFET.

* * * * *